US009202730B2

United States Patent
Moritz et al.

(10) Patent No.: US 9,202,730 B2
(45) Date of Patent: Dec. 1, 2015

(54) RAPID THERMAL PROCESSING CHAMBER

(71) Applicants: Kirk Moritz, Foster City, CA (US); Aaron Muir Hunter, Santa Cruz, CA (US)

(72) Inventors: Kirk Moritz, Foster City, CA (US); Aaron Muir Hunter, Santa Cruz, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 490 days.

(21) Appl. No.: 13/657,029

(22) Filed: Oct. 22, 2012

(65) Prior Publication Data

US 2013/0112680 A1 May 9, 2013

Related U.S. Application Data

(60) Provisional application No. 61/632,807, filed on Nov. 3, 2011, provisional application No. 61/621,179, filed on Apr. 6, 2012.

(51) Int. Cl.
*F27D 11/00* (2006.01)
*A21B 2/00* (2006.01)
*H01L 21/67* (2006.01)

(52) U.S. Cl.
CPC ...... *H01L 21/67109* (2013.01); *H01L 21/6719* (2013.01); *H01L 21/67248* (2013.01)

(58) Field of Classification Search
CPC ............ H01L 21/67109; H01L 21/6719; H01L 21/67248; H01L 21/67098–21/67115
USPC ............... 219/385, 390–393; 392/416, 418
See application file for complete search history.

(56) References Cited

U.S. PATENT DOCUMENTS

| | | | |
|---|---|---|---|
| 5,059,770 A * | 10/1991 | Mahawili | 219/391 |
| 6,274,495 B1 | 8/2001 | Omstead et al. | |
| 6,646,235 B2 | 11/2003 | Chen et al. | |
| 6,753,508 B2 * | 6/2004 | Shirakawa | 219/444.1 |
| 6,802,906 B2 | 10/2004 | Jin et al. | |
| 6,970,644 B2 * | 11/2005 | Koren et al. | 392/418 |
| 7,115,837 B2 * | 10/2006 | Timans et al. | 219/405 |
| 7,378,618 B1 | 5/2008 | Sorabji et al. | |
| 2005/0258160 A1 | 11/2005 | Goto et al. | |

(Continued)

FOREIGN PATENT DOCUMENTS

KR 2011-0061334 A 6/2011

OTHER PUBLICATIONS

International Search Report and Written Opinion for PCT/US2012/061290 dated Oct. 22, 2012.

*Primary Examiner* — Sang Y Paik
(74) *Attorney, Agent, or Firm* — Patterson & Sheridan, LLP

(57) ABSTRACT

Embodiments of the invention generally relate to RTP chambers. The chambers generally include a chamber body and chamber lid. The chamber body includes a substrate support having multiple zones of resistive heaters to heat substrates positioned on the substrate support. The chamber body also optionally includes a cooling channel to mitigate thermal stress and a thermally insulating liner disposed therein for containing heat generated during thermal processing. The chamber lid includes a lid body having an opening therethrough, and a reflective plate disposed within the opening. A plurality of pyrometers are positioned within the reflective plate to measure the temperature of a substrate at a plurality of locations across the substrate corresponding to the zones of the substrate support. The temperature of each zone is adjusted in response to the signals from the plurality of pyrometers.

19 Claims, 3 Drawing Sheets

(56) References Cited

U.S. PATENT DOCUMENTS

| | | |
|---|---|---|
| 2008/0170842 A1 | 7/2008 | Hunter et al. |
| 2008/0197121 A1 | 8/2008 | Carcasi et al. |
| 2009/0060686 A1 | 3/2009 | Morita et al. |
| 2009/0274454 A1 | 11/2009 | Aderhold et al. |
| 2010/0029094 A1 | 2/2010 | Wang et al. |
| 2010/0193154 A1* | 8/2010 | Aderhold et al. ............... 165/61 |

* cited by examiner

RAPID THERMAL PROCESSING CHAMBER

CROSS-REFERENCE TO RELATED APPLICATIONS

This application claims benefit of U.S. Provisional Patent Application Ser. No. 61/632,807, filed Nov. 3, 2011, and U.S. Provisional Patent Application Ser. No. 61/621,179, filed Apr. 6, 2012, which are herein incorporated by reference.

BACKGROUND OF THE INVENTION

1. Field of the Invention

Embodiments of the invention generally relate to rapid thermal processing (RTP) chambers.

2. Description of the Related Art

RTP is a manufacturing process which heats substrates, such as silicon wafers, to temperatures of up to 1200 degrees Celsius or greater in several seconds or less. RTP may be used for a variety of applications, including dopant activation, thermal oxidation, or metal reflow.

One type of existing RTP chamber utilizes an array of lamps to rapidly heat substrates during processing. The amount of power applied to the lamps, and thus the amount of heat generated therefrom, is controlled by a controller connected to a plurality of pyrometers disposed within the chamber. Other types of chambers utilize heated substrates supports, and may control temperature using resistance measurement devices. Existing RTP chambers represent a sizeable investment for manufacturing facilities, thus increasing the cost to produce devices.

Therefore, there is a need for an improved RTP chamber.

SUMMARY OF THE INVENTION

Embodiments of the invention generally relate to RTP chambers. The chambers generally include a chamber body and chamber lid. The chamber body includes a substrate support having multiple zones of resistive heaters to heat substrates positioned on the substrate support. The chamber body also optionally includes a cooling channel to mitigate thermal stress and a thermally insulating liner disposed therein for containing heat generated during thermal processing. The chamber lid includes a lid body having an opening therethrough, and a reflective plate disposed within the opening. A plurality of pyrometers are positioned within the reflective plate to measure the temperature of a substrate at a plurality of locations across the substrate corresponding to the zones of the substrate support. The temperature of each zone is adjusted in response to the signals from the plurality of pyrometers.

In one embodiment, a chamber comprises a chamber lid and a chamber body. A substrate support is disposed within the chamber body, and has a plurality of zones which may be independently heated to heat a substrate positioned on the substrate support. The chamber lid is disposed on the chamber body and has a circular opening disposed therethrough. The chamber lid also includes a reflector plate positioned within the circular opening and having a surface adjacent to an upper surface of the substrate support. A plurality of pyrometers are disposed through openings formed in the reflector plate to measure a temperature of the substrate at a plurality of locations across a surface of the substrate. Each pyrometer of the plurality of pyrometers corresponds to one of the zones of the plurality of zones.

In another embodiment, a chamber comprises a chamber body comprising aluminum and a chamber lid. A substrate support is disposed within the chamber body and has a plurality of zones which may be independently heated to heat a substrate positioned on the substrate support. The chamber lid is disposed on the chamber body and includes a lid body comprising aluminum. The lid body has a circular opening disposed therethrough. A reflector plate is positioned within the circular opening and has a surface adjacent to an upper surface of the substrate support. A plurality of pyrometers are disposed through openings formed in the reflector plate to measure a temperature of the substrate at a plurality of locations across a surface of the substrate. Each pyrometer of the plurality of pyrometers corresponds to one of the zones of the plurality of zones.

In another embodiment, a chamber comprises a chamber body including aluminum, a chamber lid, and a controller. A substrate support is disposed with the chamber body. The substrate support has a plurality of zones which may be independently heated to heat a substrate positioned on the substrate support. Each zone of the plurality of zones comprises a resistive heating element. The chamber lid is disposed on the chamber body and includes a lid body comprising aluminum. The lid body has a circular opening disposed therethrough. A reflector plate is positioned within the circular opening and has a surface adjacent to an upper surface of the substrate support. A plurality of pyrometers are disposed through openings formed in the reflector plate to measure a temperature of the substrate at a plurality of locations across a surface of the substrate. Each pyrometer of the plurality of pyrometers corresponds to one of the zones of the plurality of zones. The chamber also includes a controller coupled to the resistive heating element of each zone and to the plurality of pyrometers. The controller is adapted to control an amount of power applied to the resistive heating element of each zone based on a signal from each of the plurality of pyrometers.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention generally relate to RTP chambers. The chambers generally include a chamber body and chamber lid. The chamber body includes a substrate support having multiple zones of resistive heaters to heat substrates positioned on the substrate support. The chamber body also optionally includes a cooling channel to mitigate thermal stress and a thermally insulating liner disposed therein for containing heat generated during thermal processing. The chamber lid includes a lid body having an opening therethrough, and a reflective plate disposed within the opening. A plurality of pyrometers are positioned within the reflective plate to measure the temperature of a substrate at a plurality of locations across the substrate corresponding to the zones of the substrate support. The temperature of each zone is adjusted in response to the signals from the plurality of pyrometers.

Figure 1:
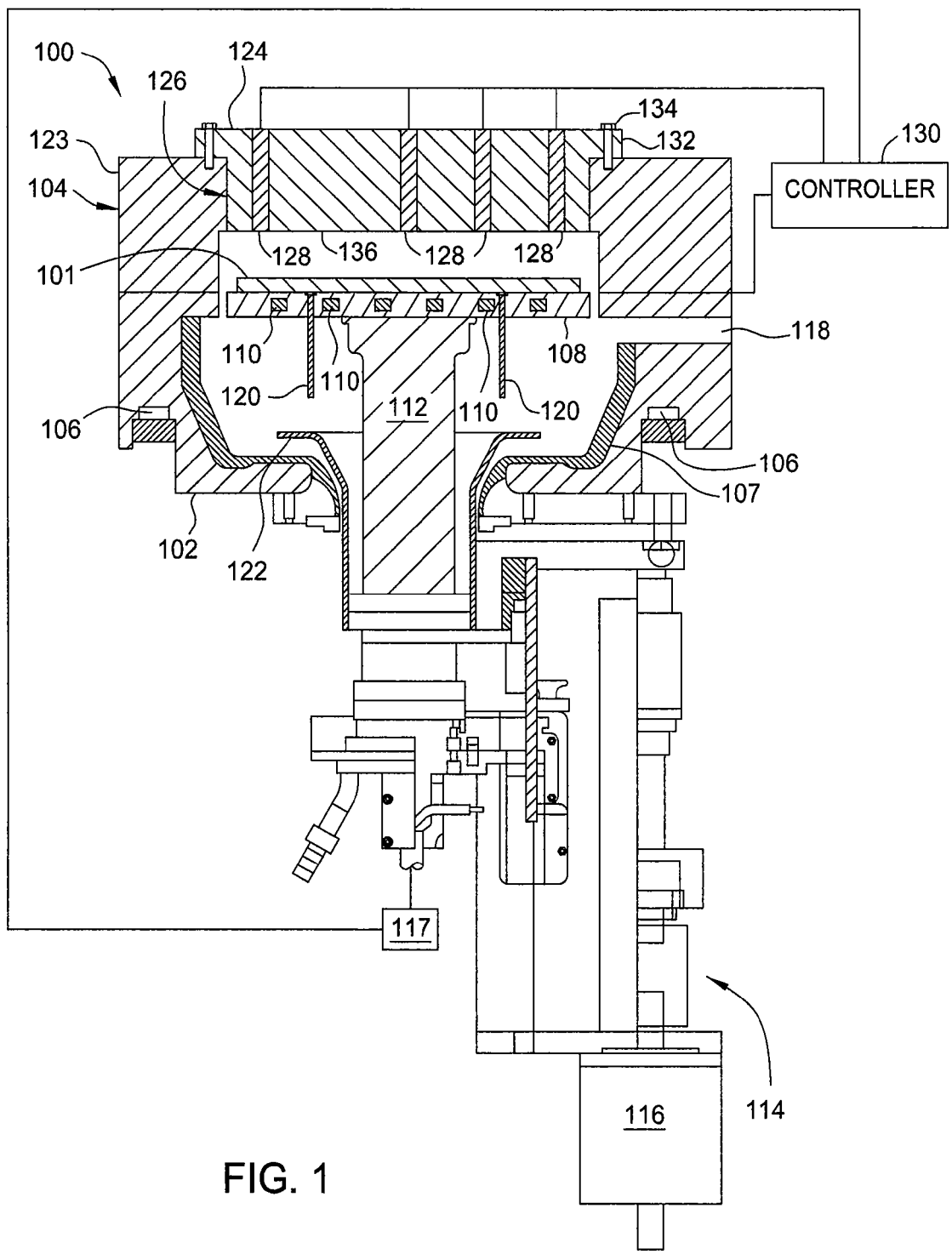
FIGS. 1 and 2 are sectional views of RTP chambers according to embodiments of the invention.

FIG. 1 is a sectional view of an RTP chamber 100 according to one embodiment of the invention. The RTP chamber 100 is adapted to thermally process a substrate 101 positioned therein. The RTP chamber includes a chamber body 102 and a chamber lid 104 disposed thereon. The chamber body 102 is formed from aluminum or an aluminum alloy, and is adapted to maintain a chamber pressure within a range of 1 Torr to about 800 Torr, such as about 10 Torr to about 350 Torr. The chamber body 102 includes a fluid passage 106 formed therein to flow a temperature control fluid therethrough to cool the chamber body 102 during processing. Cooling of the chamber body 102 reduces the probability of degradation of the chamber body 102 due to thermal stresses during heating of the substrate 101. A liner 107, formed from a thermally insulating material such as aluminum nitride, is disposed around the interior surface of the chamber body 102 to facilitate heat containment within the chamber body and to increase thermal processing efficiency. The fluid passage 106, in combination with the liner 107, allows for a low cost material, such as aluminum, to be utilized to form the chamber body 102 while still allowing the chamber body 102 to withstand the thermal stresses imposed during thermal processing.

A substrate support 108 is positioned within the chamber body 102. The substrate support 108 may be formed from sintered aluminum nitride and includes a plurality of heating elements 110, such as resistive heating elements embedded therein, to facilitate heating of the substrate 101 during processing. The heating elements 110 may be formed from molybdenum and are coupled to a power source 117 by wires disposed through a support shaft 112. The heating elements 110 provide for heating of the substrate 101 via conduction, and may heat the substrate to a temperature within a range of about 25 degrees Celsius to about 900 degrees Celsius, such as about 25 degrees Celsius to about 500 degrees Celsius. Conduction of heat may be more desirable in some circumstances than other types of heating, such as radiation. Radiation, for example, requires many expensive lamp bulbs to provide heat to a substrate. However, the lamp bulbs may frequently require replacement, thus increasing the cost to operate chambers which utilize heat lamps. Additionally, lamps may illuminate non-uniformly, thus degrading the quality of the final manufactured device. Resistive heating elements, such as the resistive heating elements 110, do not require frequent replacement and are less expensive to operate.

The support shaft 112, which may be formed from nickel, is coupled to the underside of the substrate support 108 and supports the substrate support 108. The support shaft 112 is coupled to a lifter assembly 114 which includes an actuator 116, such as a stepper motor, to facilitate positioning of the substrate 101 in a processing position adjacent the chamber lid 104, as shown. The lifter assembly 114 also facilitates removal of the substrate 101 from the chamber body 102 through an opening 118, such as a slit valve. The lifter assembly 114 is adapted to actuate the substrate support 108 in a vertical direction to allow lift pins 120 to contact a lift plate 122 positioned within the chamber body 102. Contact of the lift pins 120 with the lift plate 122 lifts the substrate 101 from the surface of the substrate support 108 as the substrate support 108 is lowered. The substrate 101 is maintained on the lift pins 120 at a position which allows for removal of the substrate 101 from the chamber body 102 through the opening 118 by a robot (not shown). A substrate 101 may be positioned within the chamber body 102 in reverse fashion.

The chamber lid 104 is positioned on the chamber body 102. The chamber lid 104 includes a lid body 123 and a reflector plate 124. The reflector plate 124 has a circular shape and is disposed within a circular opening 126 located within the lid body 123. The reflector plate 124 has an annular lip 132 having a diameter greater than the circular opening 126 to support the reflector plate 124 on the top surface of the lid body 123. The annular lip has a plurality of openings therethrough to accommodate fasteners 134, such as bolts, to secure the reflector plate 124 to the lid body 123. The reflector plate 124 is positioned within and extends through the circular opening 126. A surface 136 of the reflector plate 124 is positioned adjacent the substrate 101. The reflector plate 124 is formed from or coated with gold, silver, nickel, aluminum, or rhodium to increase the accuracy of pyrometers 128 which are disposed through the reflector plate 124 to measure the temperature of the substrate 101. In one embodiment, the reflector plate 124 may have a reflectance of about 0.50 or greater, such as about 0.90 or greater. The reflector plate 124 generally has a diameter about equal to or slightly larger than that of the substrate support 108, such as about one percent larger.

Generally, one pyrometer 128 is adapted to measure the temperature of the substrate 101 corresponding to a zone of the substrate support 108 having an individual heating element 110 therein (only four pyrometers are illustrated in FIG. 1). It is contemplated, however, that each zone of the substrate support 108 may have more than one corresponding pyrometer for increased temperature monitoring. Each pyrometer 128 is coupled with a controller 130, which is likewise coupled with the power source 117. The controller 130 facilitates closed loop control of each zone of the substrate support 108 by controlling the power applied to each of the heating elements 110 by the power source 117. When necessary, the pyrometers 128 can be easily and quickly replaced by removing the fasteners 134 from the chamber lid 104, and separating the reflector plate 124 from the lid body 123 to expose the pyrometers 128.

The pyrometers 128 facilitate accurate and inexpensive temperature measurement and control of the substrate 101. Pyrometers, unlike conventional resistive temperature measurement devices embedded in a substrate support, can measure substrate temperature directly, rather than measuring the temperature of the substrate support on which the substrate is positioned. Direct temperature measurement of the substrate provides for more accurate thermal processing of the substrate. Additionally, pyrometers 128 may be more easily replaced than resistive temperature measurement devices embedded within a substrate support.

Figure 2:
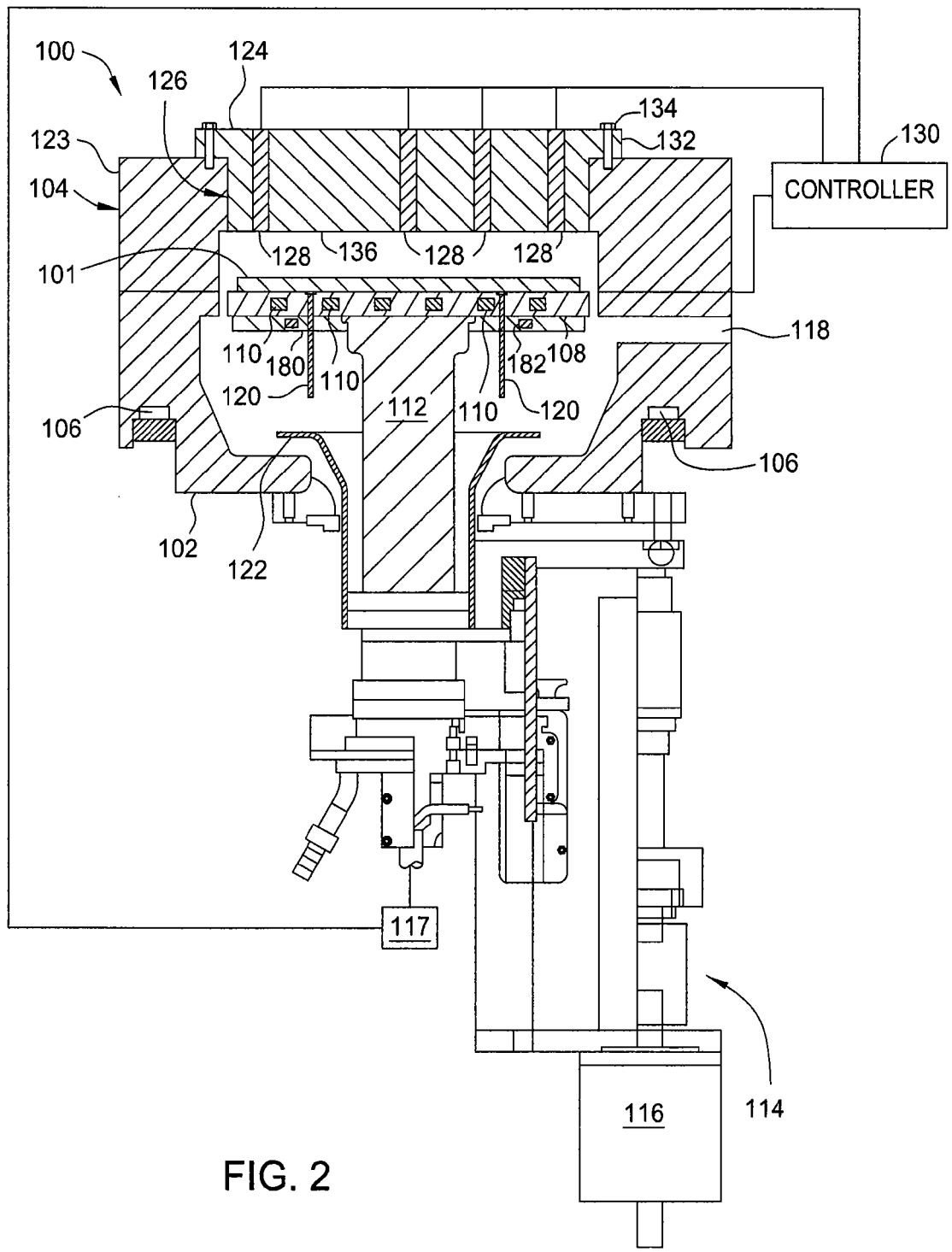

FIG. 2 illustrates a sectional view of an RTP chamber 200 according to another embodiment of the invention. The RTP chamber 200 is similar to the RTP chamber 100, except the RTP chamber 200 excludes the liner 107. Because the RTP chamber 200 does not include a liner, the temperature of the RTP chamber 200 is controlled differently than the temperature of the RTP chamber 100. For example, the flow rate of a coolant through the fluid passage 106 may be increased. Additionally or alternatively, a material capable of withstanding a higher temperature, such as an aluminum alloy or a stainless steel, may be used to construct the RTP chamber 200. Furthermore, it is contemplated that a water-cooled support bracket 180 having fluid channels 182 therein may be coupled to the substrate support 108 to facilitate cooling of the RTP chamber 200. In such an embodiment, the fluid passage 106 may optionally be eliminated.

Figure 3:
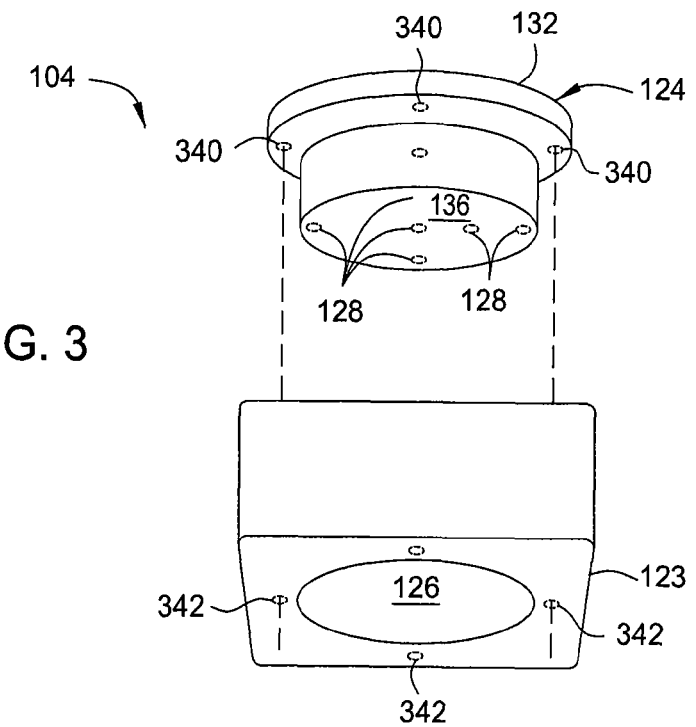
FIG. 3 is an isometric view of the chamber lid illustrated in FIGS. 1 and 2.

FIG. 3 is an isometric view of the chamber lid 104 illustrated in FIGS. 1 and 2. The reflector plate 124 and the lid body 123 are shown as separated in order to more clearly illustrate the respective components of the chamber lid 104. The lid body 123 is generally formed from the same material as the chamber body 102 (shown in FIG. 1), such as an aluminum alloy or aluminum. The reflector plate 124 includes a plurality of openings 340 disposed through the annular lip 132. The openings 340 are aligned with the openings 342 (shown in phantom) formed in the lid body 123 for insertion of a fastener therein. The openings 342 are generally not formed completely through the lid body 123 to prevent contamination of the chamber body 102 through the openings 342. A plurality of pyrometers 128 are exposed through the surface 136 of the reflector plate 124 to facilitate temperature measurement of a substrate 101 (shown in FIG. 1). In the embodiment illustrated in FIG. 2, six pyrometers are shown, each of which corresponds to one of the six heating zones of the substrate support 108 shown in FIG. 4. It is contemplated that more than one pyrometer 128 per zone may be utilized to increase the accuracy of temperature monitoring.

Figure 4:
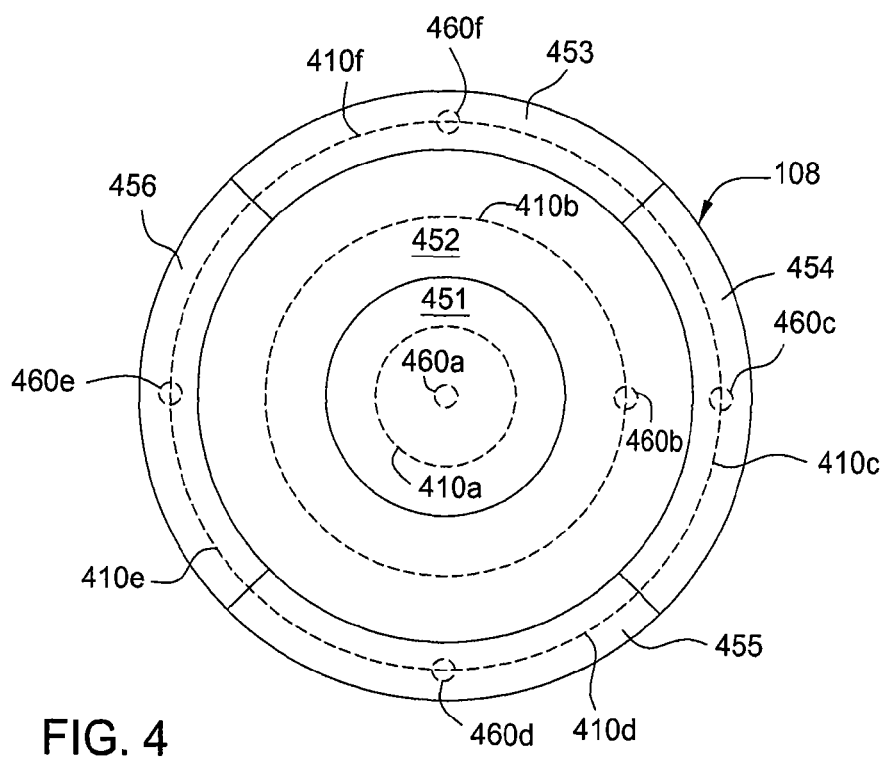
FIG. 4 is a top plan view of the substrate support illustrated in FIGS. 1 and 2.

FIG. 4 is a top plan view of the substrate support 108 illustrated in FIGS. 1 and 2. The substrate support 108 may be formed from sintered aluminum nitride and includes a plurality of zones, such as zones 451-456. Each of the zones 451-456 includes a corresponding independent heating element 410a-410f (shown in phantom) which are embedded within the substrate support 108 and can be independently controlled to provide independent temperature control of each of the zones 451-456. The heating elements 410a-410f may be formed from a material such as molybdenum.

Zone 451 is circularly shaped and disposed centrally on the substrate support 108. Zone 451 may cover about 5 percent to about 15 percent of the upper surface of the substrate support 108, for example, about 10 percent. Zone 451 is heated via heating element 410a, which has a circular shape. Zone 452 circumscribes the zone 451. Zone 452 may cover about 55 percent to about 70 percent of the upper surface of the substrate support 108, for example, about 63 percent. Zone 452 is heated by the circularly shaped heating element 410b. Zones 453-456 are disposed around the outer perimeter of the zone 452, which each of zones 453-456 covering approximately 90 degrees of the outer circumference of zone 452. Each of zones 453-456 covers about 3 percent to about 10 percent of the upper surface of the substrate support 108, for example, about 6.6 percent. Zones 453-456 facilitate accurate temperature control of the perimeter area of a substrate disposed thereon. The perimeter area of a substrate is typically the area most likely to have a temperature which deviates from the average substrate temperature, due to the removal of heat near the outer edge of the substrate. Thus, the relatively smaller sizes of zones 453-456 facilitate precise temperature control of the outer edge of a substrate, while the majority of the heating of the substrate is effected by the inner zones 451 and 452.

The position of temperature sensing of each pyrometer 128 is shown in phantom on the surface of the substrate support 108. The temperature sensing points 460a-460f are generally positioned substantially centrally over each of zones 451-456, which the exception of temperature sensing point 460b. Zone 452 is annular in shape; however, since zone 452 only contains a single heating element 410b, the temperature of zone 452 is generally consistent. Thus, the temperature sensing point 460b can be positioned generally at any location along zone 452 and still yield an accurate temperature measurement. It is contemplated that additional pyrometers or additional heating elements may be utilized to further refine temperature control of the substrate support 108 and a substrate supported thereon.

Embodiments of the present invention provide low cost RTP chambers utilizing efficient and inexpensive heating and temperature-sensing devices. The chambers utilize aluminum or aluminum alloy components, which allow for cheaper fabrication of the chamber components as compared to other metals, for example, stainless steels. The use of aluminum or aluminum alloys, which may melt at some of the processing temperatures utilized during thermal processing, is enabled through the use of thermally insulating liners and cooling channels. The chambers utilize thermally insulating liners to increase the efficiency of thermal processes performed within the chamber, thus reducing the cost to operate the chambers, as well as to protect chamber components from undesired heating. One or more cooling channels disposed within the RTP chamber body allow for the internal volume of the RTP chamber to be rapidly heated to a temperature beyond the melting point of the chamber body material. The one or more cooling channels maintain the chamber body at a temperature below the melting point of the chamber body material during the heating process, thus preserving the integrity of the chamber body.

The chambers also utilize substrate supports having heating elements embedded therein to conductively heat substrates positioned thereon. Thermal conduction is an efficient manner of heating substrates and does not require frequent replacement of costly components like systems utilizing lamp bulbs. Substrate temperature is measured via pyrometers and the amount of heat applied to substrates is controlled using a closed-loop. The pyrometers allow substrate temperature to be measured directly rather than using a resistive temperature measuring device to measure the substrate support temperature. Direct temperature measuring of the substrate facilitates more accurate thermal processing of the substrate.

While the foregoing is directed to embodiments of the present invention, other and further embodiments of the invention may be devised without departing from the basic scope thereof, and the scope thereof is determined by the claims that follow.

We claim:

1. A chamber, comprising:
   a chamber body;
   a substrate support disposed within the chamber body, the substrate support having a plurality of zones which are adapted to be independently heated to heat a substrate positioned on the substrate support, wherein a resistive heating element is disposed in each zone of the plurality of zones; and
   a chamber lid disposed on the chamber body, the chamber lid comprising:
   a lid body comprising aluminum, the lid body having a circular opening disposed therethrough;
   a reflector plate positioned within the circular opening and having a surface adjacent to an upper surface of the substrate support, the reflector plate having a first section with a first diameter and a second section with a second diameter smaller than the first diameter; and
   a plurality of pyrometers disposed through openings formed in the reflector plate to measure a temperature of the substrate a plurality of locations across a surface of the substrate, wherein each pyrometer of the plurality of pyrometers corresponds to each zone of the plurality of zones.

2. The chamber of claim 1, wherein the resistive heating elements are controlled by the plurality of pyrometers.

3. The chamber of claim 1, wherein the plurality of zones comprises a first zone having a circular shape centrally disposed on the substrate support, and a second zone circumscribing the first zone.

4. The chamber of claim 3, wherein the plurality of zones further comprises a third zone, a fourth zone, and fifth zone, and a sixth zone, and wherein the third zone, the fourth zone, the fifth zone, and the sixth zone are disposed radially outward of the second zone.

5. The chamber of claim 4, wherein the third zone, the fourth zone, the fifth zone, and the sixth zone each extend around about 90 degrees of the circumference of the substrate support.

6. The chamber of claim 1, wherein the chamber body further comprises a thermally insulating liner disposed on an interior surface thereof and a fluid passage formed therein for containing a temperature controlling fluid.

7. The chamber of claim 1, further comprising a plurality of lift pins disposed through the substrate support, the lift pins adapted to contact a lift plate positioned within the chamber body.

8. A chamber, comprising:
a chamber body comprising aluminum;
a support shaft disposed within the chamber body;
a substrate support disposed within the chamber body and coupled to an upper surface of the support shaft, the substrate support having a plurality of zones which are adapted to be independently heated to heat a substrate positioned on the substrate support, wherein a resistive heating element is disposed in each zone of the plurality of zones; and
a chamber lid disposed on the chamber body, the chamber lid comprising:
a lid body comprising aluminum, the lid body having a circular opening disposed therethrough;
a reflector plate positioned within the circular opening and having a surface adjacent to an upper surface of the substrate support, the reflector plate having a first section with a first diameter and a second section with a second diameter smaller than the first diameter, the first section of the reflector plate positioned on an upper surface of the lid body to support the reflector plate within the circular opening; and
a plurality of pyrometers disposed through openings formed in the reflector plate to measure a temperature of the substrate at a plurality of locations across a surface of the substrate, wherein each pyrometer of the plurality of pyrometers corresponds to one of the zones of the plurality of zones.

9. The chamber of claim 8, wherein the plurality of zones comprise a first zone having a circular shape centrally disposed on the substrate support, and a second zone circumscribing the first zone.

10. The chamber of claim 9, wherein the plurality of zones further comprises a third zone, a fourth zone, and fifth zone, and a sixth zone, and wherein the third zone, the fourth zone, the fifth zone, and the sixth zone are disposed radially outward of the second zone.

11. The chamber of claim 10, wherein the plurality of independently-controllable resistive heating elements are adjusted in response to temperatures measured by the plurality of pyrometers.

12. The chamber of claim 11, wherein the chamber body further comprises a thermally insulating liner disposed on an interior surface thereof.

13. A chamber, comprising:
a chamber body comprising aluminum;
a substrate support disposed with the chamber body, the substrate support having a plurality of zones which are adapted to be independently heated to heat a substrate positioned on the substrate support, wherein each zone of the plurality of zones comprises a resistive heating element;
a chamber lid disposed on the chamber body, the chamber lid comprising:
a lid body comprising aluminum, the lid body having a circular opening disposed therethrough;
a reflector plate positioned within the circular opening and having a surface adjacent to an upper surface of the substrate support, the reflector plate having a first section with a first diameter and a second section with a second diameter smaller than the first diameter, the first section of the reflector plate positioned on an upper surface of the lid body to support the reflector plate within the circular opening; and
a plurality of pyrometers disposed through openings formed in the reflector plate to measure a temperature of the substrate a plurality of locations across a surface of the substrate, wherein each pyrometer of the plurality of pyrometers corresponds to one of the zones of the plurality of zones; and
a controller coupled to the resistive heating element of each zone and to the plurality of pyrometers, the controller adapted to control an amount of power applied to the resistive heating element of each zone based on a signal from each of the plurality of pyrometers.

14. The chamber of claim 13, wherein the plurality of zones comprise a first zone having a circular shape centrally disposed on the substrate support, and a second zone circumscribing the first zone.

15. The chamber of claim 14, wherein the plurality of zones further comprises a third zone, a fourth zone, and fifth zone, and a sixth zone, and wherein the third zone, the fourth zone, the fifth zone, and the sixth zone are disposed radially outward of the second zone.

16. The chamber of claim 15, wherein the third zone, the fourth zone, the fifth zone, and the sixth zone each extend around about 90 degrees of the circumference of the substrate support.

17. The chamber of claim 16, wherein the substrate support is formed from aluminum.

18. The chamber of claim 17, wherein the resistive heating elements comprise molybdenum.

19. The chamber of claim 13, further comprising a plurality of lift pins disposed through the substrate support, the lift pins adapted to contact a lift plate positioned within the chamber body.

* * * * *